United States Patent [19]

Bauer

[11] Patent Number: 5,619,047
[45] Date of Patent: Apr. 8, 1997

[54] SEMICONDUCTOR DIODE IN WHICH ELECTRONS ARE INJECTED INTO A REVERSE CURRENT

[75] Inventor: Friedhelm Bauer, Suhr, Switzerland

[73] Assignee: Asea Brown Boveri AG, Baden, Switzerland

[21] Appl. No.: 527,330

[22] Filed: Sep. 12, 1995

[30] Foreign Application Priority Data

Oct. 31, 1994 [DE] Germany .......................... 44 38 896.9

[51] Int. Cl.⁶ ................................................. H01L 29/74
[52] U.S. Cl. ........................ 257/135; 257/140; 257/144; 257/152; 257/163
[58] Field of Search ................................... 257/135, 137, 257/140, 144, 152, 163, 328, 329

[56] References Cited

FOREIGN PATENT DOCUMENTS

| | | |
|---|---|---|
| 3633161C2 | 7/1991 | Germany . |
| 3631136C2 | 9/1992 | Germany . |
| 5-315618 | 11/1993 | Japan .................................... 257/328 |
| 5-347414 | 12/1993 | Japan .................................... 257/328 |
| 6-163907 | 6/1994 | Japan .................................... 257/328 |

OTHER PUBLICATIONS

Article entitled: "Comparison of High Voltage Power Rectifier Structures" by M. Mehrotra and B. J. Baliga, Proceedings of the ISPSD, pp. 199–204, IEEE 1993.

*Primary Examiner*—Minhloan Tran
*Attorney, Agent, or Firm*—Oblon, Spivak, McClelland, Maier & Neustadt, P.C.

[57] ABSTRACT

A diode (1) is specified which has electron injection means on the anode-side principal surface (3). After the reverse-current peak has been traversed, said means inject electrons into the anode emitter. This compensates for holes and the danger of a dynamic field overshoot, which may result in an avalanche breakdown, is reduced. The electron injection means preferably comprise an n-channel MOS cell. High voltages and high dI/dt values can be safely handled with a diode according to the invention. A diode in accordance with the invention is preferably used as freewheeling diode in a converter circuit arrangement.

9 Claims, 1 Drawing Sheet

SEMICONDUCTOR DIODE IN WHICH ELECTRONS ARE INJECTED INTO A REVERSE CURRENT

BACKGROUND OF THE INVENTION

Field of the Invention

The invention relates to the field of semiconductor diodes. It relates, in particular, to a freewheeling diode for converter circuit arrangements.

Discussion of Background

The article entitled "Comparison of High Voltage Power Rectifier Structures" by M. Mehrotra and B. J. Baliga, Proceedings of the ISPSD, pages 199–204, IEEE 1993 discusses various structures of high-voltage diodes. Diodes according to the PiN, P-iN, MPS, SSD, SPEED and SFD designs are compared. In particular, the reverse-current problems during the commutation of a current are investigated.

Such diodes comprise, between a cathode-side and an anode-side principal surface, an n-doped semiconductor substrate into which a heavily p-doped anode emitter is diffused from the anode-side principal surface and a heavily n-doped cathode emitter is diffused from the cathode-side principal surface. Anode and cathode are formed by the metal layers covering the corresponding principal surface.

In modern converters, the freewheeling diodes frequently cause faults, in particular at high rates of change of current and voltage during the commutation of a current. In the case of contemporary freewheeling diodes, this results in not only the semiconductor switch, but also the freewheeling diode having to be heavily protected with passive protective circuits. This is due to the stored charge of the diode which, during turn-off (commutation of the current), results in the known reverse-current peak. In the case of contemporary freewheeling diodes for GTOs, the current change must not exceed approximately 300 A/s.

In the case of future MOS-controlled semiconductor switches (for example, high-voltage IGBTs having blocking voltages of 2.5 kV to 4.5 V), which are faster than the GTOs, these problems become still more critical. The IGBT is a comparatively fast switch which is able to handle reliably even very high dI/dt values. However, this also increases the loading of the freewheeling diodes. In addition, it would be desirable for cost reasons if the freewheeling diode could also be operated without protective circuit (snubber). This has resulted, inter alia, in optimized diode designs (see, for example, the SPEED design in the abovementioned article), which are tailored to operation with fast IGBTs having blocking voltages up to 1600 V.

Minimization of the stored charge, for example by short carrier lifetimes, generally results in a reduction of the reverse-current peak. A fast voltage rise and consequently a short duration of the commutation process can be achieved by means of the flat plasma profiles which are made possible, for example, by the SPEED design. But even if all the possibilities of minimizing the stored charge and of limiting the reverse-current peak are utilized, the power loss in the case of such optimized diodes rises to such high values that avalanche breakdown of the diode becomes probable.

SUMMARY OF THE INVENTION

Accordingly, one object of the invention is to provide a novel diode with which high dI/dt values and high voltages can be handled without difficulty, in particular without the danger of an avalanche breakdown increasing.

This object is achieved in the case of a diode of the type mentioned at the outset by the features of the first claim.

The essence of the invention is therefore that there are provided on the anode-side principal surface electron injection means which are so designed that they make possible an injection of electrons during the commutation of a current.

The design according to the invention is based on the following physical facts and considerations:

Studies on diodes have shown that the maximum in the power loss is not at the highest current densities, but, on the contrary, in the region of low values. Since the reverse-current peak does not depend very greatly on the forward-current density, the stored charge is reduced more rapidly at low forward-current densities. This results in a faster voltage increase. The fact that the reverse-current peak and the power loss peak do not take place at the same point in time, but with a short delay, is remarkable. The power loss peak occurs in the region of positive values of dI/dt. After the reversal of the polarity of the diode voltage, the holes drain via the anode through the space-charge zone, while the electrons return to cathode via the $n^+$-type emitter. Consequently, the dynamic field overshoot at the anode caused by the holes is responsible for the breakdown of the diode (this phenomenon is known by the term "dynamic avalanche"). The dynamic breakdown takes place at peak power losses of approximately 300 to 500 $kW/cm^2$.

Consequently, a diode structure is desirable in which further electrons can be injected in a controlled manner from the anode side during the turn-off or commutation of the current. The negative charge of the electrons compensates for part of the positive charge of the holes. The dynamic field overshoot can consequently be substantially reduced so that essentially only the doping level governs the electric field level.

Preferably, this electron donor is controlled by means of a MOS control electrode (gate). A preferred structure which comprises controllable electron injection means on the anode-side principal surface has at that point, according to the invention, at least one n-channel MOS cell.

Said MOS cell can be integrated into the heavily p-doped anode emitter of the diode by designing the anode emitters as well-like regions, the semiconductor substrate penetrating to the anode-side principal surface between two adjacent anode emitter regions. The MOS cells are then formed by heavily n-doped short-circuit regions which are disposed at the two peripheries of the anode emitter regions. Disposed on top thereof is a control electrode which extends in each case from one short-circuit region of an anode emitter region to the short-circuit region of the adjacent anode emitter region via the semiconductor substrate which penetrates to the principal surface.

To reduce the field overshoot caused by the holes, the n-channel of the MOS cells is now opened, for example, a few fractions of a μs after the reverse-current peak. This can be achieved by applying a voltage of approximately 15 V which is positive with respect to the anode to the control electrode. Since the cathode of the diode is positive with respect to the anode under reverse conditions, the electrons drain in the direction of the cathode and consequently in opposition to the holes flowing towards the anode. The required neutralization of the positive hole charge is consequently achieved and a reduction in the electric field can be obtained.

A freewheeling diode in accordance with the invention is preferably used as freewheeling diode in converter circuit arrangements containing semiconductor switches. A freewheeling diode is disposed in antiparallel to the semiconductor switch and takes over a current flowing in the reverse direction of the semiconductor switch. A separate control unit which generates the required control voltage of approximately 15 V and applies it at the correct point in time to the control electrode can be provided for operating and driving the diode according to the invention. Obviously, the control unit for the diode may also be integrated into one which is in any case already present for the semiconductor switches.

A particularly inexpensive variant is one wherein, instead of a separate control unit for the diode, an inductance is connected in the anode current path. Said inductance, which is already provided in the ideal case by the inductance of the bonding wires, generates a voltage which is proportional to the rate of current change dI/dt. The polarity of said voltage with respect to the anode is such that the control electrode of the diode according to the invention is negatively polarized in the region of decreasing diode current, i.e. up to the point in time where the reverse-current peak is reached. After the reverse-current peak has been traversed, the polarity of the induced voltage changes, with the result that a positive voltage is applied to the control electrode. Said positive voltage is established approximately at the point in time of the maximum power loss. Consequently, said voltage results in the desired injection of electrons which counteract the field overshoot due to holes (dynamic avalanche).

Further exemplary embodiments emerge from the corresponding dependent claims.

All in all, the diode according to the invention makes it possible to handle high dI/dt values and voltages without there being the danger of an avalanche breakdown.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1:
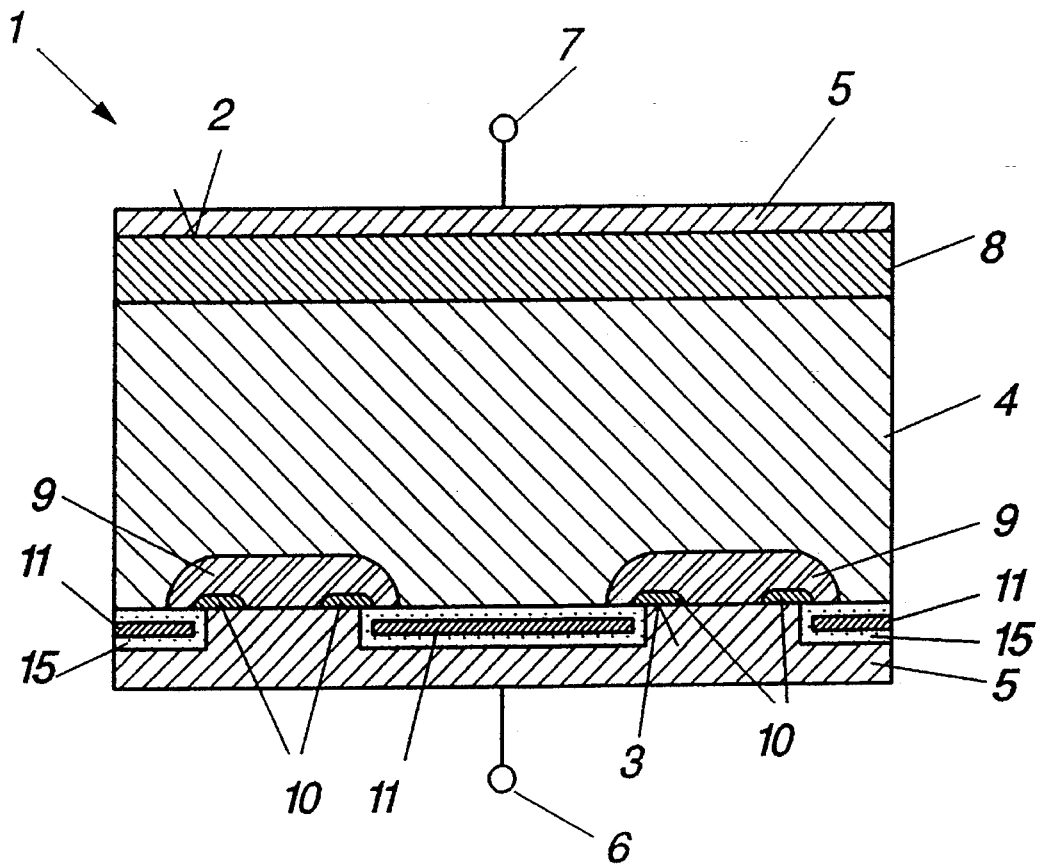
FIG. 1 shows a portion of a diode according to the invention in section.

The reference symbols used in the drawings and their meaning are listed in the list of designations.

DESCRIPTION OF THE PREFERRED EMBODIMENTS

Referring now to the drawings, wherein like reference numerals designate identical or corresponding parts throughout the several views, FIG. 1 shows a portion of a diode in accordance with the invention in section. Such a diode 1 comprises, between a first principal surface 2 and a second principal surface 3, an n-doped semiconductor substrate 4. In the figure, n-doped regions are shaded from the top left to the bottom right, p-doped regions are shaded with double lines and metallizations are shaded with lines extending from the top right to the bottom left. In the semiconductor regions, the density of the shading corresponds approximately to the doping concentration.

An $n^+$-doped cathode emitter 8 is diffused into the semiconductor substrate 4 from the first principal surface 2 and a $p^+$-doped anode emitter 9 is diffused into the substrate 4 from the principal surface 3. The corresponding electrodes, cathode 7 and anode 6 are formed by metal layers 5 covering the associated emitters 8 and 9, respectively.

According to the invention, the anode emitter 9 comprises at least one well-like region which is contacted by the metallization 5 of the anode electrode 6. The semiconductor substrate 4 penetrates to the second principal surface 3 between two adjacent anode emitter regions 9. Essential to the invention are the $n^+$-doped short-circuit regions 10 which are disposed on both sides of the well-like anode emitter regions 9. The short-circuit regions 10 and the semiconductor substrate 4 which penetrates to the second principal surface 3 between two adjacent anode emitter regions 9 are spanned by a control electrode 11 which is disposed in an insulated manner. The insulation 15 (dotted region in FIG. 1) may be composed, for example, of $SiO_2$ and the control electrode, for example, of polysilicon. That part of the anode emitter 9 which extends from the periphery to the short-circuit regions and is spanned by the control electrode 11 is denoted below as channel region. If a voltage which is positive with respect to the anode is now applied to the control electrode, an n-channel forms in the channel regions. Electrons are thereby injected. The structure according to the invention of the anode emitter therefore functions like an MOS-controlled electron injection source.

The $p^+$-doped anode emitter 9 of the diode 1 in accordance with the invention has, in contrast to the SPEED design mentioned at the outset, a very high injection efficiency. With a carrier lifetime of only 4 μs for electrons and 1 ks for holes, a forward voltage of only 2 V results for a current density of 100 A/cm$^2$.

Figures 2, 3:
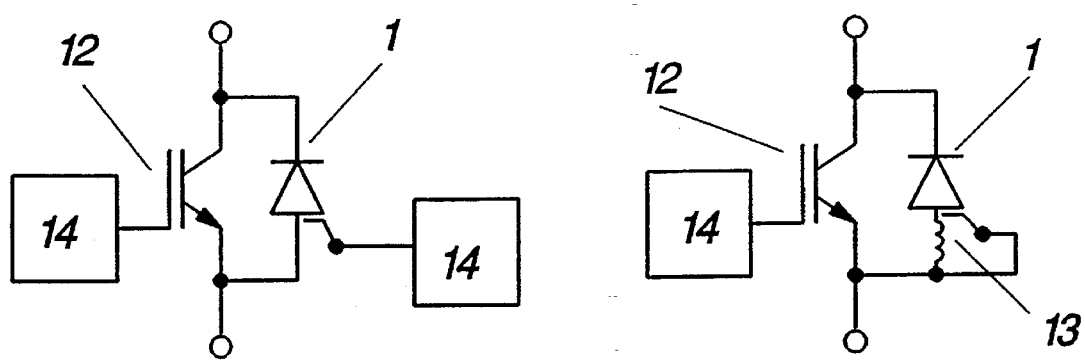
FIG. 2 shows a circuit arrangement in which the diode in accordance with the invention can be used.
FIG. 3 shows a further circuit arrangement for which the diode according to the invention is suitable.

The diode 1 according to the invention is advantageously used as freewheeling diode in a converter circuit arrangement containing at least one semiconductor switch 12. FIGS. 2 and 3 show such circuit arrangements. The semiconductor switch 12 forms, for example, a part of a polyphase converter. As depicted, it may be an IGBT, but other types of semiconductor switches are also possible.

A functionally separate drive unit 14 may be provided to drive the diode 1 in accordance with the invention (FIG. 2). At the same time, it is immaterial whether said drive unit is physically integrated into a possibly already present drive unit 14 of a semiconductor switch 12. If the semiconductor switch is, for example, an IGBT module, an integration is expedient since, under some circumstances, the diode is already integrated in the IGBT module. The control function of the diode could be combined, for example in an expanded ASIC, with the control function of the IGBT.

Regardless of where the drive unit-for the diode is provided, its function must in any case be such that a voltage which is positive with respect to the anode potential (approximately 15 V) is applied to the control electrode of the diode a short time after the reverse-current peak. As a result, a conducting n-channel which provides the desired injection of electrons during the commutation of a current is formed in the channel regions.

The time for applying the positive voltage depends on the reverse-current peak. The full voltage is generally already present 50 ns to 100 ns after the reverse-current peak has been traversed. The voltage should be applied at this point in time at the latest.

A more inexpensive variant and one which is simpler in relation to the circuit complexity consists in only an inductance 13 being connected in the anode path instead of a separate drive unit 14 for the diode 1 (FIG. 3). A voltage proportional to the current change dI/dt is induced across said inductance 13. If the diode 1 is integrated into a module housing, the bonding wires which connect the diode electrodes to the leads of the module present precisely the necessary inductance. In this case, a separate inductance may even be dispensed with. The polarity of the induced voltage is such that the control electrode is negatively polarized in the region of decreasing diode current, i.e. up to the point in time where the reverse-current peak is reached. As soon as the current direction changes after the reverse-current peak has been traversed, the polarity of the induced voltage changes and a positive voltage is applied to the control electrode of the diode. Because of the normal finite rate of voltage increase, this takes place, in particular, approximately at the point in time of the power loss maximum. The desired electron injection is consequently triggered automatically at the optimum point in time.

FIG. 1 shows only a portion of a diode 1 in accordance with the invention. A plurality of the cells shown are, however, necessary for a serviceable diode. Since high hole-current densities have to be collected by the $p^+$-type anode emitter 9 during commutation, there is the danger of triggering the parasitic n-p-n structure formed by the semiconductor substrate 4, the anode emitter 9 and the short-circuit regions 10, as in the case of a power MOSFET. For this reason, the chosen cell spacing, i.e. the spacing of two well-like anode emitter regions 9, must be markedly less than in the IGBT. Very small cell spacings are, however, also to be avoided since the electron emission is made more difficult and even completely prevented as a consequence of the JFET effect. In connection with a tested diode, a cell spacing of approximately 50 m has proved optimum.

Since the diode in accordance with the invention is to be suitable, in particular, for high voltages (from approximately 1200 V upwards), a typical thickness of >100 μm results for the semiconductor substrate 4 with a doping of approximately $1$–$2 \cdot 10^{14}$ cm$^{-3}$. The cathode emitter 8 then has a typical doping of >$10^{17}$ cm$^{-3}$. The insulating layer 15 on the anode side has an oxide thickness of approximately 100 μm. Typical values for the well-like anode emitter regions 9 are: peripheral concentration approximately $10^{19}$ cm$^{-3}$, depth approximately 5 μm. The short-circuit regions 10 are preferably doped with $10^{19}$ cm$^{-3}$. The window opening for the metallization 5 in the region of the anode emitter 9 is typically 10–20 μm.

A diode in accordance with the invention therefore has a structure with which high voltages and dI/dt values can be handled safely.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A semiconductor diode having a reverse-current when a current flowing through the diode is being turned off, comprising:
   an n-doped semiconductor substrate between first and second principal surfaces,
   a cathode which is formed by a metal layer covering the first principal surface,
   an anode which is formed by a metal layer covering the second principal surface,
   an n-doped cathode emitter which is diffused into the semiconductor substrate from the first principal surface and a p-doped anode emitter which is diffused into the semiconductor substrate from the second principal surface, and
   electron injection means provided in the p-doped anode emitter and which inject electrons into the reverse-current during a commutation of the current flowing through the diode.

2. The diode as claimed in claim 1, wherein the electron injection means comprise a plurality of n-channel MOS cells provided in the p-doped anode emitter.

3. The diode as claimed in claim 2, wherein the anode emitter comprises a plurality of p-doped well-like regions, the semiconductor substrate penetrating to the second principal surface between two adjacent well-like regions, and the MOS cells comprise n-doped short-circuit regions diffused into the well-like anode emitter regions and covered by a control electrode disposed in an insulated manner on top of the second principal surface.

4. A converter circuit arrangement comprising:
   at least one semiconductor switch; and
   a freewheeling diode having a reverse-current when a current flowing through the diode is being turned off and which is connected in antiparallel to the semiconductor switch, said freewheeling diode including,
   an n-doped semiconductor substrate between first and second principal surfaces,
   a cathode which is formed by a metal layer covering the first principal surface,
   an anode which is formed by a metal layer covering the second principal surface,
   an n-doped cathode emitter which is diffused into the semiconductor substrate from the first principal surface,
   a p-doped anode emitter which is diffused into the semiconductor substrate from the second principal surface, and,
   electron injection means provided in the p-doped anode emitter and which inject electrons into the reverse-current during a commutation of the current flowing through the diode.

5. The converter circuit arrangement as claimed in claim 4, wherein the electron injection means comprise a plurality of n-channel MOS cells provided in the p-doped anode emitter and the anode emitter comprises a plurality of p-doped well-like regions, the semiconductor substrate penetrating to the second principal surface between two adjacent well-like regions, and the MOS cells comprise n-doped short-circuit regions diffused into the well-like anode emitter regions and covered by a control electrode disposed in an insulated manner on top of the second principal surface and wherein the control electrode of the diode is connected to an external control unit which is designed in such a way that it applies a voltage which is positive with respect to the anode to the control electrode during the commutation.

6. The converter circuit arrangement as claimed in claim 4, wherein the electron injection means comprise a plurality of n-channel MOS cells provided in the p-doped anode emitter and the anode emitter comprises a plurality of p-doped well-like regions, the semiconductor substrate penetrating to the second principal surface between two adjacent well-like regions, and the MOS cells comprise n-doped short-circuit regions diffused into the well-like anode emitter regions and covered by a control electrode disposed in an insulated manner on top of the second principal surface, and wherein the anode is connected to the semiconductor switch via an inductance and the control electrode is directly connected to the semiconductor switch.

7. The converter circuit arrangement as claimed in claim 6, wherein the diode is integrated into a housing having an anode lead, a cathode lead and a control lead and the inductance is formed by a connecting wire which connects the anode to the anode lead.

8. The converter circuit arrangement as claimed in claim 4, wherein the electron injection means comprises at least one n-channel MOS cell.

9. The converter circuit arrangement according to claim 8, wherein the anode emitter comprises a plurality of p-doped well-like regions, the semiconductor substrate penetrating to the second principal surface between two adjacent well-like regions, and the MOS cells comprise n-doped short-circuit regions diffused into the well-like anode emitter regions and covered by a control electrode disposed in an insulated manner on top of the second principal surface.

* * * * *